United States Patent [19]

Kato et al.

[11] Patent Number: 4,803,358

[45] Date of Patent: Feb. 7, 1989

[54] SCANNING ELECTRON MICROSCOPE

[75] Inventors: Makoto Kato, Kawasaki; Koichi Homma; Fuminobu Komura, both of Yokohama; Toshihiro Furuya, Katsuta, all of Japan

[73] Assignee: Hitachi, Ltd., Tokyo, Japan

[21] Appl. No.: 169,599

[22] Filed: Mar. 17, 1988

[30] Foreign Application Priority Data

Mar. 18, 1987 [JP] Japan .................................. 62-61020

[51] Int. Cl.⁴ .............................................. H01J 37/20
[52] U.S. Cl. .................................... 250/310; 250/307; 250/442.1; 364/559; 364/170; 364/571.04
[58] Field of Search ............ 250/310, 306, 307, 442.1, 250/397, 440.1; 364/571, 559, 170

[56] References Cited

U.S. PATENT DOCUMENTS 3,971,936  7/1976  Hoppe ............................. 250/442.1
4,627,009  12/1986  Holmes et al. ...................... 364/559

OTHER PUBLICATIONS

Via, IBM Technical Disclosure Bulletin, vol. 26, No. 3A, Aug. 1983, pp. 1173-1174.

Primary Examiner—Bruce C. Anderson
Assistant Examiner—Jack I. Berman
Attorney, Agent, or Firm—Antonelli, Terry & Wands

[57] ABSTRACT

A scanning electron microscope for scanning the surface of a specimen with an electron beam to detect secondary electrons, backscattered electrons, or X-rays emitted from the specimen, thereby forming an image of the surface of the specimen, is provided with a specimen table capable of making a horizontal movement, a vertical movement a rotating operation and a tilting operation, an arithmetic unit for converting the output of a detector for detecting the secondary electrons, backscattered electrons or X-ray into a digital signal to store the digital signal, and for calculating the amount of each of the horizontal movement, vertical movement, rotating operation and tilting operation of the specimen table, on the basis of the stored information, an indication given from the outside, and others, and a controller for controlling the specimen table on the basis of a calculated value from the arithmetic unit.

6 Claims, 13 Drawing Sheets

SCANNING ELECTRON MICROSCOPE

BACKGROUND OF THE INVENTION

The present invention relates to the observation or inspection of a fine object, and more particularly to a scanning electron microscope (hereinafter referred to as "SEM") which can readily change the field of view for observing a fine object.

In a case where the field of view of an SEM for observing a specimen is changed, two methods can be used. In one of the methods, the point of incidence of an electron beam is changed by adjusting an electron lens. In the other method, a specimen table loaded with the specimen is moved. The former method has advantages that it is not required to move a specimen table but the field of view is changed by a simple operation. However, the field of view is changed only in a narrow range, and moreover the positional accuracy of the point of incident of the electron beam is not satisfactory. Thus, the latter method is actually used. In the latter method, the specimen table is moved by the combination of the horizontal movement, rotation and tilt of the specimen table, and these operations of the specimen table are coupled directly with the mechanical movement of controls which are operated by an operator. In a case where the specimen table has a simple structure, that portion of a specimen which is now observed, may go out of the field of view only by tilting the specimen table a little. In order to solve the above problem and to make easy the observation of a fine object, a specimen table provided with a sophisticated movable part has been proposed in, for example, an article entitled "Five-Degrees-of-Freedom Stage for a Scanning Electron-Beam Microscope" (IBM Technical Disclosure Bulletin, Vol. 26, No. 3A, pages 1173 and 1174, 1983). Further, a system for testing a semiconductor device has been developed, in which a specimen table is automatically moved so that measured points are successively irradiated with an electron beam, or is automatically moved to a position which is specified on a design drawing, and accurate positioning is carried out on the basis of video information. This system is described in, for example, an article entitled "EB Test System linked with CAD Database" by F. Komatsu et al. in the Material of the 97th Meeting of the 132nd Committee on the Application of Charged Particle Beam to Industries, pages 63 to 68 (Japan Society for Promotion of Science.

According to the specimen table described in the former article, the mechanical operation of specimen table is independent of the magnification of the SEM, and thus the moving speed of the field of view varies with the magnification. Further, the mechanical operation of specimen table is limited by the mechanical structure thereof, and moreover, the operation accuracy of the specimen table is reduced by mechanical wear thereof. While the system described in the latter article can be used only for a case where an object to be observed is previously determined.

SUMMARY OF THE INVENTION

It is an object of the present invention to provide an SEM which is applicable to a case where details of an object to be observed are not known, which can change the field of view in regard to an image now observed, without taking into consideration the mechanical structure of a specimen table, and which is scarcely affected by the reduction in operation accuracy of the specimen table due to mechanical wear thereof.

In order to attain the above object, according to the present invention, there is provided an SEM which comprises a specimen table capable of making parallel displacement, a rotating operation and tilting operation, an arithmetic unit for calculating relative and absolute positions of a scanning point on a specimen, and a controller for controlling the specimen table on the basis of information on the calculated positions.

The arithmetic unit calculates a relation between an image now observed and the attitude of the specimen table, and the controller changes the field of view in accordance with an operator's demand while taking into consideration the information obtained from the arithmetic unit and the operation accuracy of the specimen table. Thus, the operator can choose a desired field of view without being conscious of the mechanical structure of the specimen table.

DESCRIPTION OF THE PREFERRED EMBODIMENT

Figure 1:
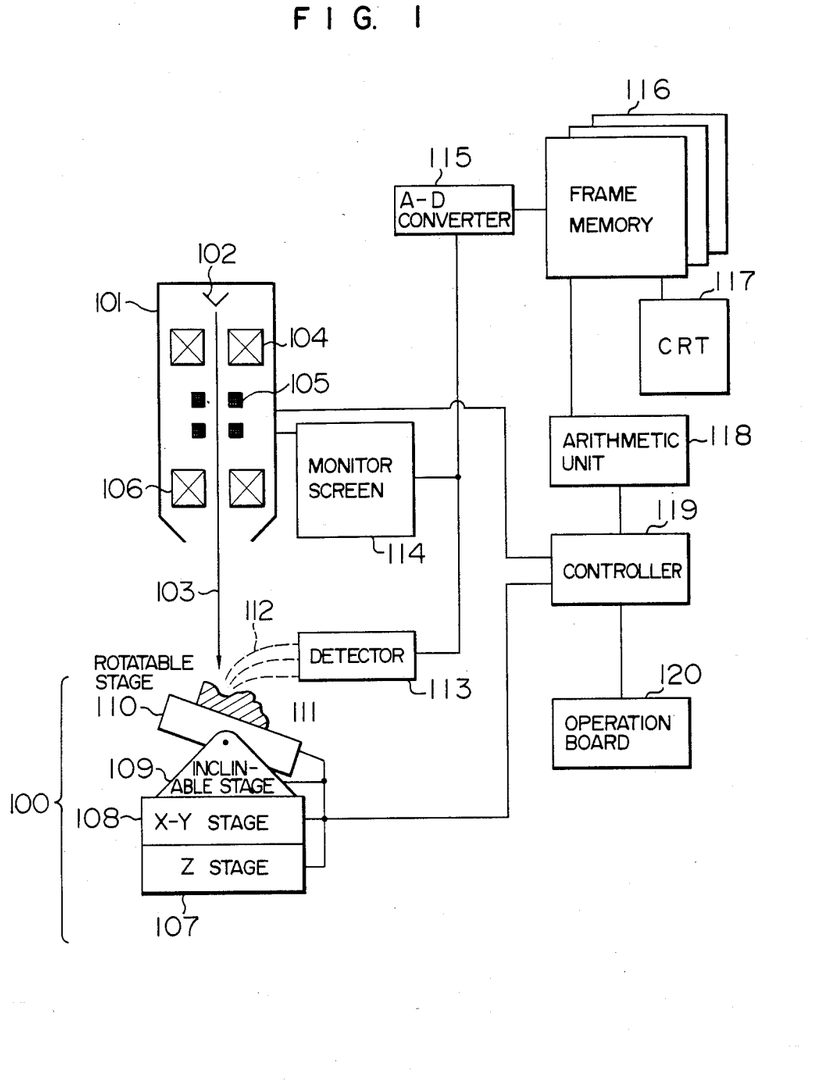
FIG. 1 is a block diagram showing the construction of an embodiment of an SEM according to the present invention.

FIG. 1 shows the construction of an embodiment of an SEM according to the present invention. Referring to FIG. 1, an electron beam 103 emitted from an electron gun 102 which is mounted in the column 101 of electron microscope, passes through a condenser lens 104, a deflection coil 105 and an objective lens 106, to be deflected and to scan the surface of a specimen 111. A specimen table 100 load with the specimen 111 is made up of a Z-stage 107 capable of moving in a vertical direction, an X-Y stage 108 capable of moving in two directions on a horizontal plane, an inclinable stage 109 having a plane capable of tilting a normal thereto in a vertical plane, and a rotatable stage 110 capable of rotating in a slant plane formed by the inclinable stage 109. In the specimen table 100, the movement of a lower stage is transmitted to an upper stage. For example, when the X-Y stage 108 is moved, the inclinable stage 109 and the rotatable stage 110 move together with the X-Y stage 108, but the Z-stage 107 is kept unmoved. Signals such as secondary electrons, backscattered electrons and X-rays are emitted from the specimen 111 in accordance with the scanning of the specimen with the electron beam, and are detected by a detector 113. The output signal of the detector 113 is used for forming an image of the surface of the specimen 111 on a monitor screen 114 which is scanned with an electron beam in synchronism with the operation of the deflection coil 105. Further, the output signal of the detector 113 is converted by an analog-to-digital converter 115 into a digital signal, which is stored in a frame memory 116 in the form of a picture image. The frame memory 116 is so constructed as to be able to store a plurality of picture images. A CRT (namely, cathode ray tube) 117 is used for displaying the contents of the frame memory 116 selectively. An arithmetic unit 118 carries out processing such as the search for corresponding feature points on two picture images, on the basis of the contents of the frame memory 116. A controller 119 controls the Z-stage 107, the X-Y stage 106, the inclinable stage 109 and the rotatable stage 110, on the basis of information from the arithmetic unit 118 and in accordance with an indication from an operation board 120.

Figure 2:
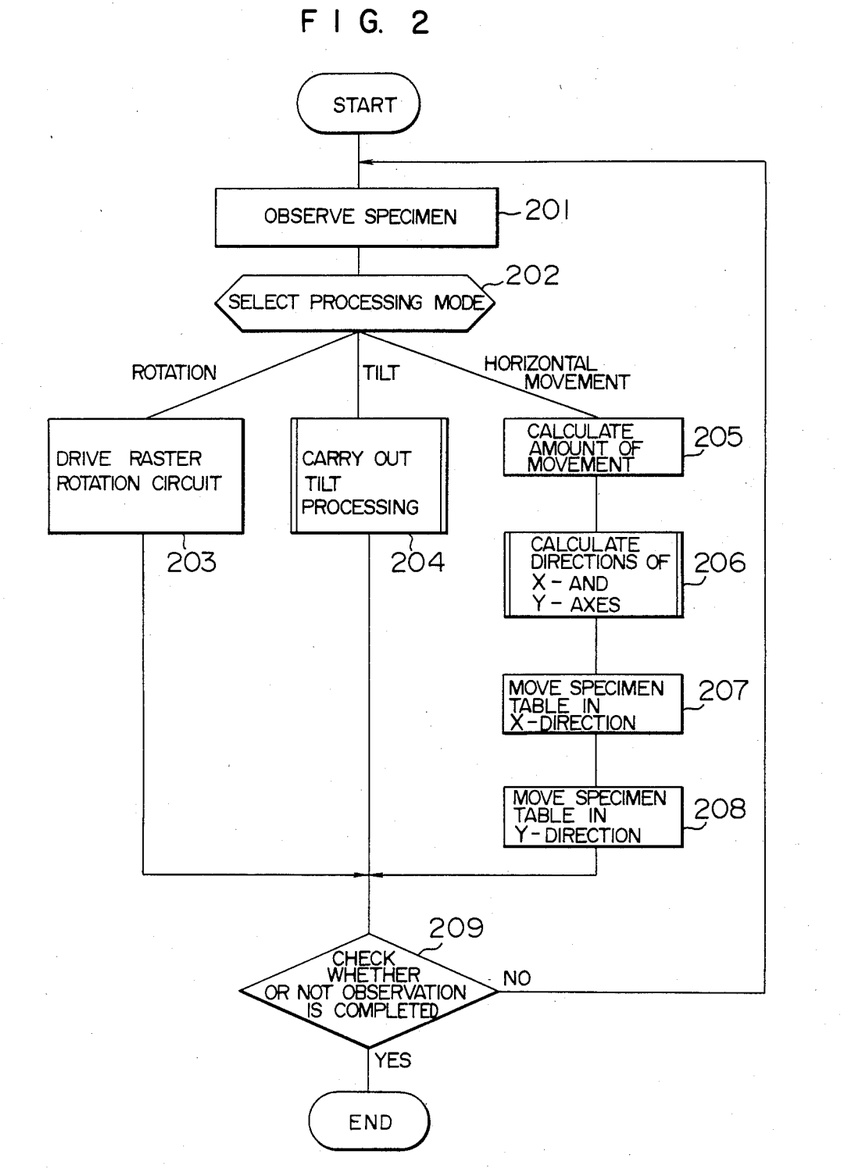
FIG. 2 is a flow chart showing field-of-view changing operations which are performed by the embodiment of FIG. 1.

Next, explanation will be made of a field-of-view changing operation which is performed by the present embodiment, with reference to FIG. 2. Referring to FIG. 2, an operator observes the surface of the specimen 111 by the electron microscope, that is, the present embodiment (step 201). In order to change the field of view, the operator selects one of processing modes with the aid of the operation board 120 (step 202). The processing modes include the rotation, tilt and horizontal movement of field of view with respect to an image now observed. The tilt of field of view is carried out in such a manner that an axis on the image is specified as an axis of tilt, and the horizontal movement is carried out in two directions perpendicular to each other.

In a case where the rotation of field of view is selected, a raster rotation circuit is driven to control the deflection coil 105 of FIG. 1, thereby rotating a scanning direction (step 203). As a result, the field of view is rotated.

Figure 3:
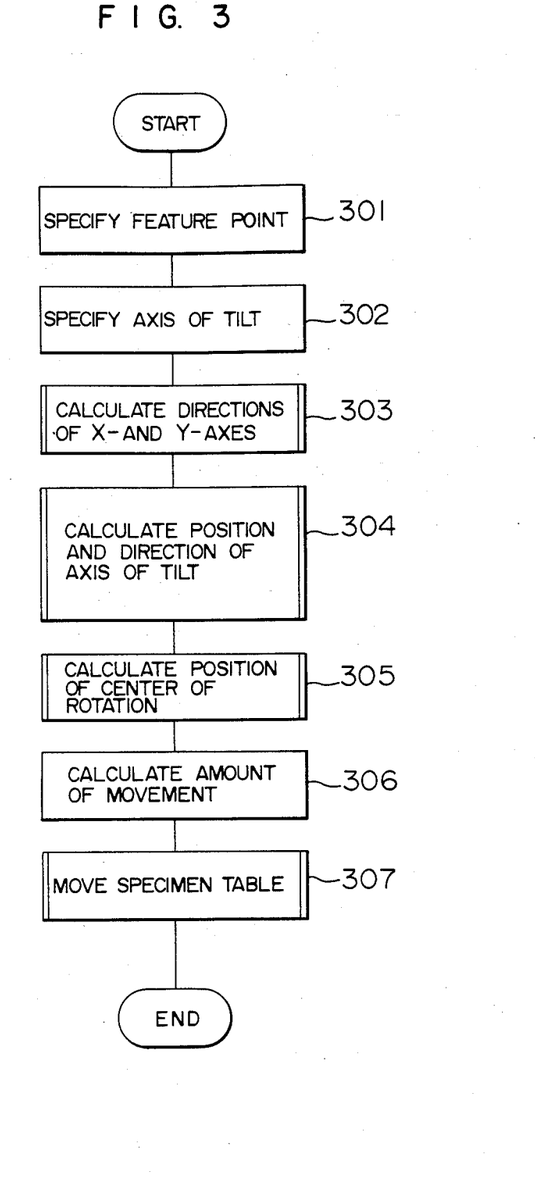
FIG. 3 is a flow chart showing the details of processing which is carried out in the step 204 of FIG. 2.
Figure 4:
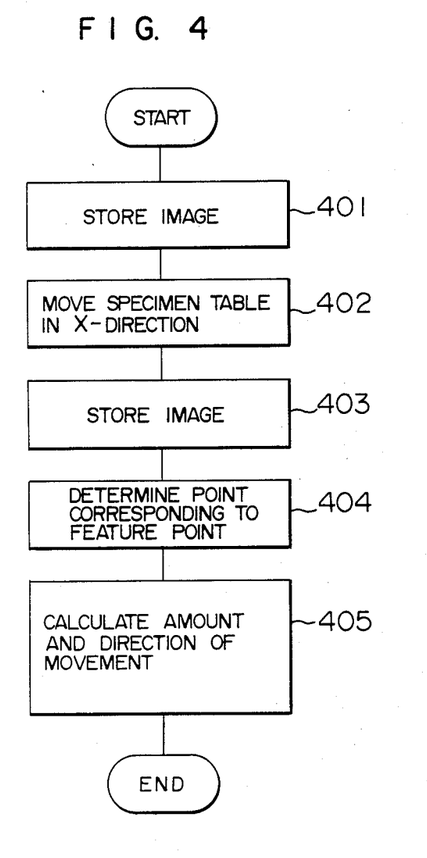
FIG. 4 is a flow chart showing the details of processing which is carried out in the step 206 of FIG. 2 and the step 303 of FIG. 3.
Figure 8A:
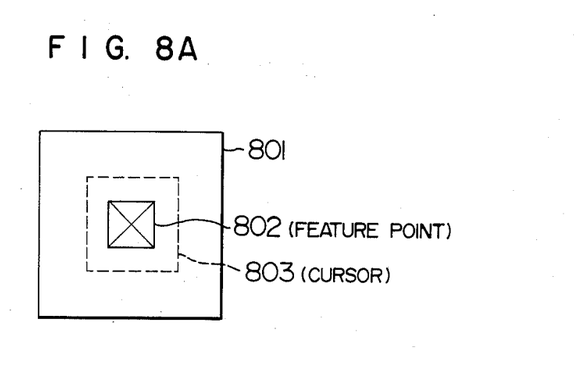
FIGS. 8A and 8B are schematic diagrams showing a feature point on the display screen of a cathode ray tube (hereinafter referred to as "CRT").
Figure 8B:
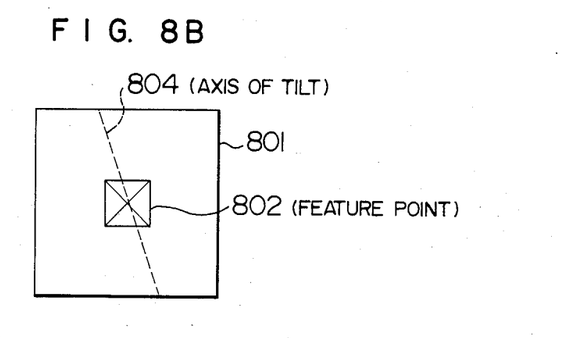
Figure 9:
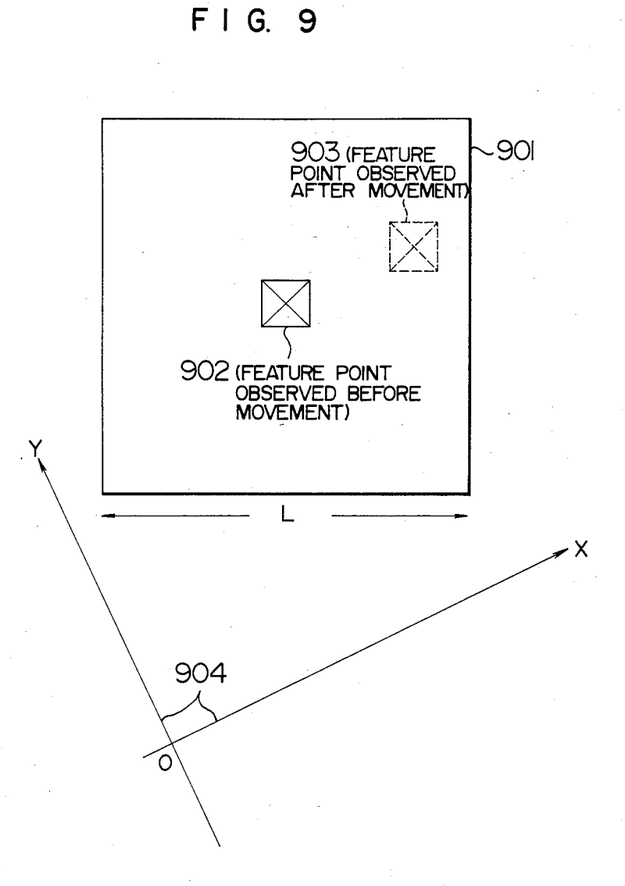
FIG. 9 is a schematic diagram showing the positions of a feature point on the display screen of a CRT which are observed before and after the movement of coordinate axes.
Figure 10A:
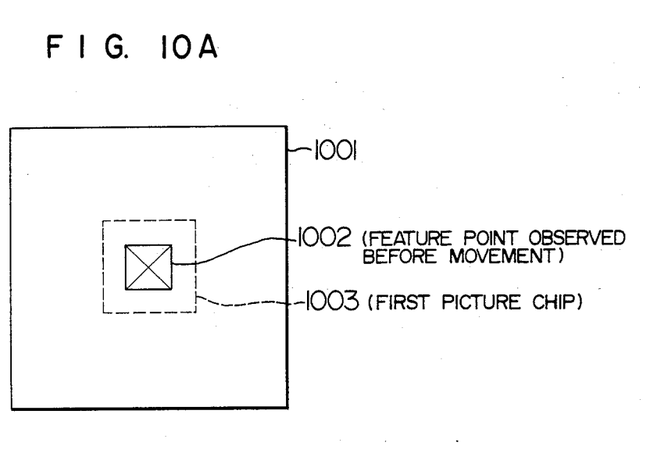
FIGS. 10A and 10B are schematic diagrams showing two positions of a picture chip on the display screen of a CRT.
Figure 10B:
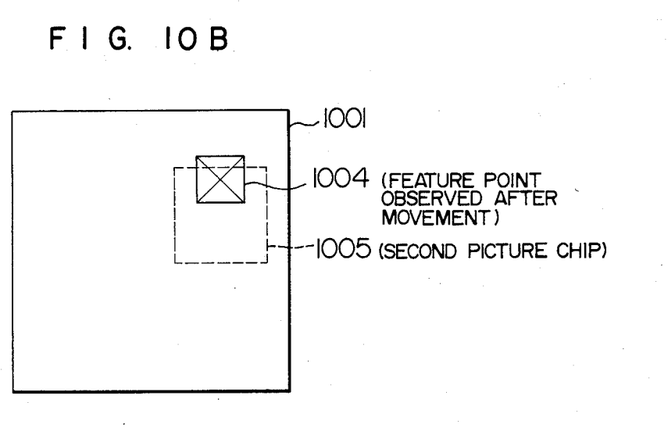

In a case where the tilt of field of view using an axis on the observed image as an axis of tilt is selected, complicated tilt processing is carried out (step 204). This processing is required to include the movement of the inclinable stage 109 and the X-Y stage 108. The tilt processing will be explained below in detail, with reference to FIG. 3. Referring to FIG. 3, a feature point which is to be observed in a different direction, is specified (step 301). This processing is carried out in the following manner. Referring to FIG. 8A, a feature point 802 on the display screen of the CRT 801 is specified by a cursor 803, and an image portion covered by the cursor 803 is stored in a memory, to be used for pattern matching. Next, an axis of tilt (namely, an axis of rotation for tilt) is specified (step 302). Referring to FIG. 8B, an axis of tilt 804 is specified on the display screen of the CRT 801. In step 303, the X- and Y-directions on the present image are calculated. This calculation will be explained below, with reference to FIG. 4. Referring to FIG. 4, an image which is observed before the specimen table 100 is moved, is stored in the memory (step 401). Next, the X-Y stage 108 of the specimen table is moved in an X-direction (step 402). Referring to FIG. 9, the amount of movement of the X-Y stage is determined in accordance with the magnification of the electron microscope so that a feature point observed before the movement of the X-Y stage does not go out of the display screen of the CRT 901. In more detail, when the length of one side of the display screen and the magnification of electron microscope are expressed by L and f, respectively, the X-Y stage may be moved in the X-direction by the distance equal to L/5f. In a case where X- and Y-axes are indicated by coordinate axes 904, the feature point 902 is moved to a position which is indicated by reference numeral 903. In step 403, an image obtained after the movement of the X-Y stage is stored in the memory. In step 404, it is checked by inter-image calculation what part of the image stored in the step 403 corresponds to the feature point 902 observed before the movement of the X-Y stage. This check will be explained below in detail with reference to FIGS. 10A and 10B. FIGS. 10A and 10B show images observed before and after the movement of the X-Y stage, respectively. In each of FIGS. 10A and 10B, an image on the display screen of the CRT 1001 is a digital image, and can be expressed by a two-dimensional matrix N×N. Hence, the above check is carried out by calculating a correlation coefficient between two images of FIGS. 10A and 10B. Now, let us express images which are observed before and after the movement of the X-Y stage, by A- and B-matrices, respectively. Further, let us express the gray level of the cell in the i-th row, the j-th column of the A-matrix by $A_{ij}$, and express the gray level of the cell in the i-th row, the j-th column of the B-matrix by $B_{ij}$. Then, a correlation coefficient $R_{iji'j'}$ between the position of the cell in the i-th row, the j-th column of the A-matrix and the position of the cell in the i'-th row, the j'-th column of the B-matrix, can be given by the following equation:

$$R_{iji'j'} = \frac{\sum\limits_{k=-M}^{M}\sum\limits_{l=-M}^{M}(A_{i+k,j+l} - \overline{A}_{ij})(B_{i'+k,j'+l} - \overline{B}_{i'j'})}{\sqrt{\sum\limits_{k=-M}^{M}\sum\limits_{l=-M}^{M}(A_{i+k,j+l} - \overline{A}_{ij})^2}\sqrt{\sum\limits_{k=-M}^{M}\sum\limits_{l=-M}^{M}(B_{i'+k,j'+l} - \overline{B}_{i'+j'})^2}}$$

where $\overline{A}_{ij} = \dfrac{1}{(2M+1)^2} \sum\limits_{k=-M}^{M} \sum\limits_{l=-M}^{M} A_{i+k,j+l}$ $\overline{B}_{i'j'} = \dfrac{1}{(2M+1)^2} \sum\limits_{k=-M}^{M} \sum\limits_{l=-M}^{M} B_{i'+k,j'+l}$ It is to be noted that the value of M is determined so that each of suffices $i+k$, $j+l$, $i'+k$, and $j'+l$ lies in a numerical range from 1 to N. In other words, the above equation indicates a correlation coefficient between a first picture chip 1003 which is shown in FIG. 10A, is expressed $A_{\alpha\beta}$ (where $\alpha=i-M, \cdots, i+M$, $\beta=j-M, \cdots, j+M$), and contains a feature point 1002 observed before the movement of the X-Y stage, and a second picture chip 1005 which is shown in FIG. 10B and expressed by $B_{\alpha\beta}$ (where $\alpha=i'-M, \cdots, i'+M$, $\beta=j'-M, \cdots, j'+M$). The correlation coefficient $R_{i,j,i'j'}$ is increased as the degree of resemblance between the first and second picture chips 1003 and 1005 is larger. That is, when the second picture chip 1005 contains the feature point 1004 observed after the movement of the X-Y stage, and has the same pattern as observed in the first picture chip 1003, the correlation coefficient becomes maximum. Accordingly, when the second picture chip 1005 is moved in the B-matrix so that the correlation coefficient $R_{ij\,i'j'}$ becomes maximum. The feature point 1004 corresponding to the feature point 1002 can be determined. In step 405, the amount and direction of the movement are calculated from the information on the positions of the feature points 1002 and 1004. In a case where the cell in the i-th row, the j-th column of the A-matrix is the center of the first picture chip 1003 and the cell in the i'-th row, the j'-th column of the B-matrix is the center of the second picture chip 1005, a straight line which connects these cells, indicates an X-direction.

Figure 5:
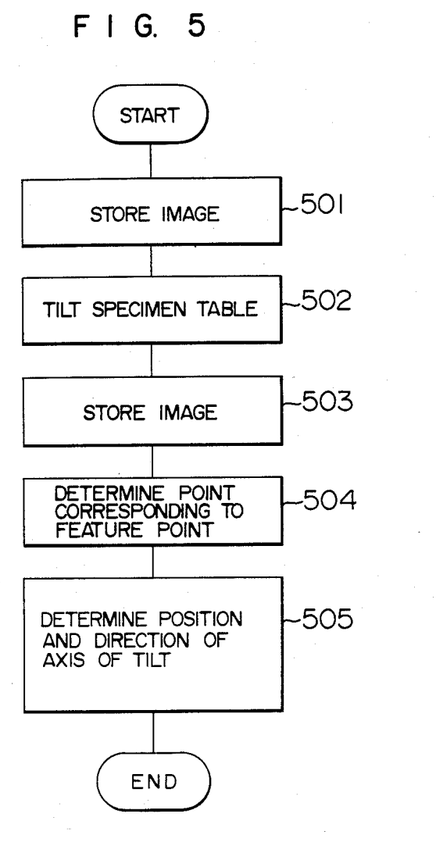
FIG. 5 is a flow chart showing the details of processing which is carried out in the step 304 of FIG. 3.
Figure 11:
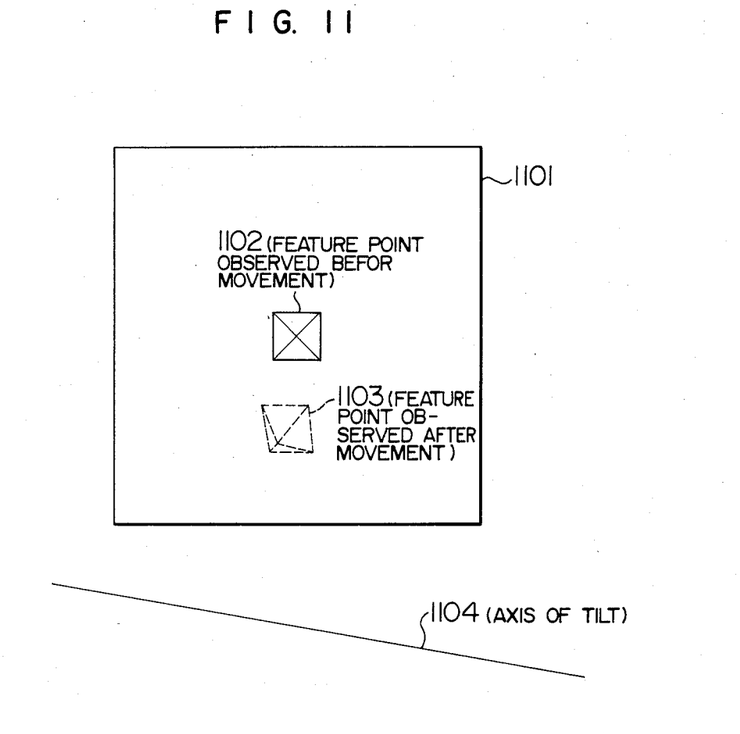
FIG. 11 is a schematic diagram showing a relation between a feature point and an axis of rotation for tilt (hereinafter referred to as "axis of tilt").
Figure 12:
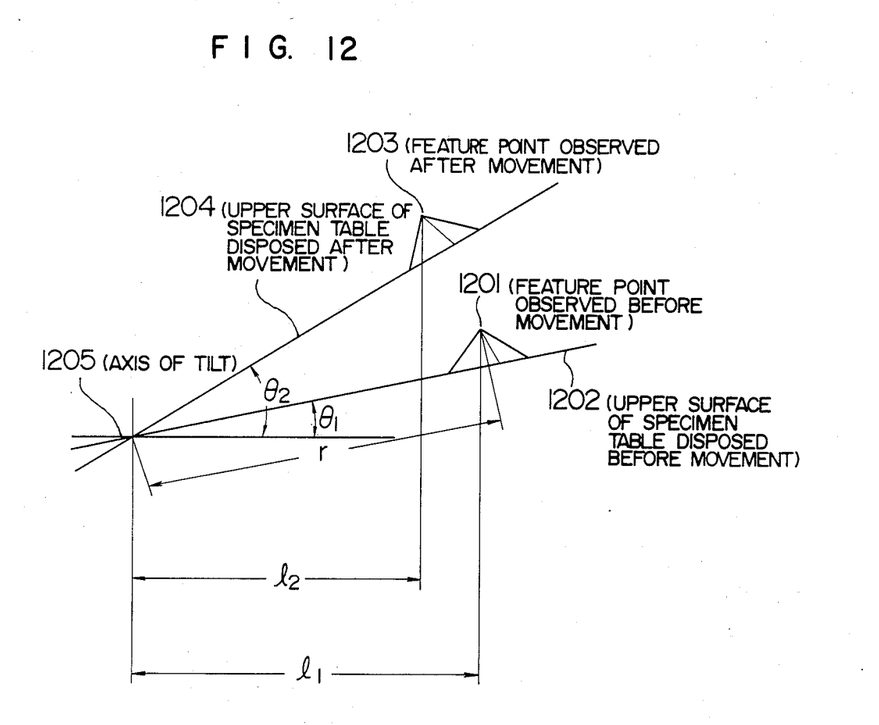
FIG. 12 is a schematic diagram for explaining how the distance between a feature point and an axis of tilt is calculated.

Referring back to FIG. 3, the position of a mechanical axis of tilt for tilting an image is calculated (step 304). This calculation will be explained below in detail, with reference to FIGS. 5 and 11. Referring to FIG. 5, an image observed before the movement of the specimen table is stored in the memory (step 501). In step 502, the specimen table is tilted. Referring to FIG. 11, the specimen table is tilted so that a feature point 1102 observed before the tilting operation does not go out of the display screen of the CRT 1101. Since the thickness of the specimen 111 is not known, it is not possible to show the degree of tilt accurately, but an approximate value of the angle of tilt can be specified. That is, when the angle of tilt of the specimen table prior to the tilting operation, the width of the specimen table, the magnification of electron microscope, and the length of one side of the display screen of the CRT 1101 are expressed by $\theta_1$, W, f, and L, respectively, the specimen table can be tilted by an angle of $$\left\{ \cos^{-1}\left( \cos\theta_1 - \dfrac{L}{2fW} \right) - \theta_1 \right\}$$

radian, without pushing a feature point which lies at the center of the display screen, out of the display screen. In step 503, an image which contains a feature point 1103 observed after the tilting operation, is stored in the memory. In step 504, a feature point 1103 corresponding to the feature point 1102 are determined in the same manner as carried out in the step 404 of FIG. 4. In step 505, the position and direction of an axis of tilt 1104 are calculated. When the pixel in the i-th row, the j-th column of the image stored in the step 501 corresponds to the pixel in the i'-th row, the j'-th column of the image stored in the step 503, the axis of tilt 1104 is perpendicular to a straight line which connects these pixels. The calculation of the distance between a feature point and an axis of tilt will be explained below, with reference to FIG. 12. Referring to FIG. 12, a feature point 1201 observed before the movement of the specimen table lies on the upper surface 1202 thereof which makes an angle $\theta_1$ with a horizontal plane, and the feature point 1203 observed after the movement of the specimen table lies on the upper surface 1204 thereof which makes an angle $\theta_2$ with the horizontal plane. When a horizontal distance between the feature point 1201 and an axis of tilt 1205, a horizontal distance between the feature point 1203 and the axis of tilt 1205, and a distance along the upper surface 1202 or 1204 between the feature point 1201 or 1203 and the axis of tilt 1205, are expressed by $l_1$, $l_2$, and r respectively, we can obtain the following equations:

$$l_1 = r\cos\theta_1$$
$$l_2 = r\cos\theta_2$$

$$l_1 - l_2 = \dfrac{1}{f}\sqrt{(i-i')^2 + (j-j')^2}$$

Hence, the distance r is given by the following equation:

$$r = \dfrac{\sqrt{(i-i')^2 + (j-j')^2}}{f(\cos\theta_1 - \cos\theta_2)}$$

In the above processing, the thickness of the specimen is not taken into consideration. Hence, an accurate value of the distance r cannot be obtained, but the position of the axis of tilt can be roughly determined.

Figure 6:
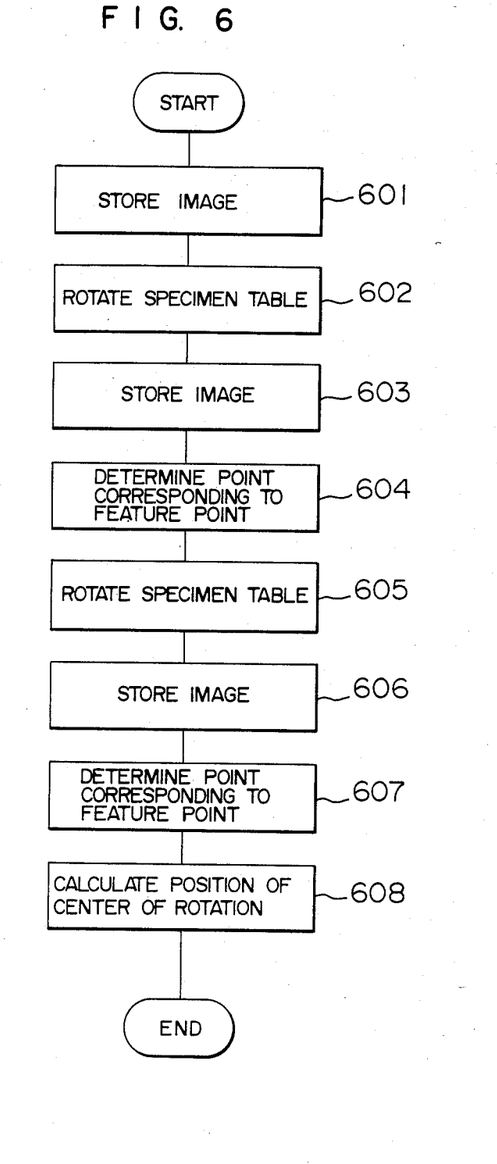
FIG. 6 is a flow chart showing the details of processing which is carried out in the step 305 of FIG. 3.
Figure 13:
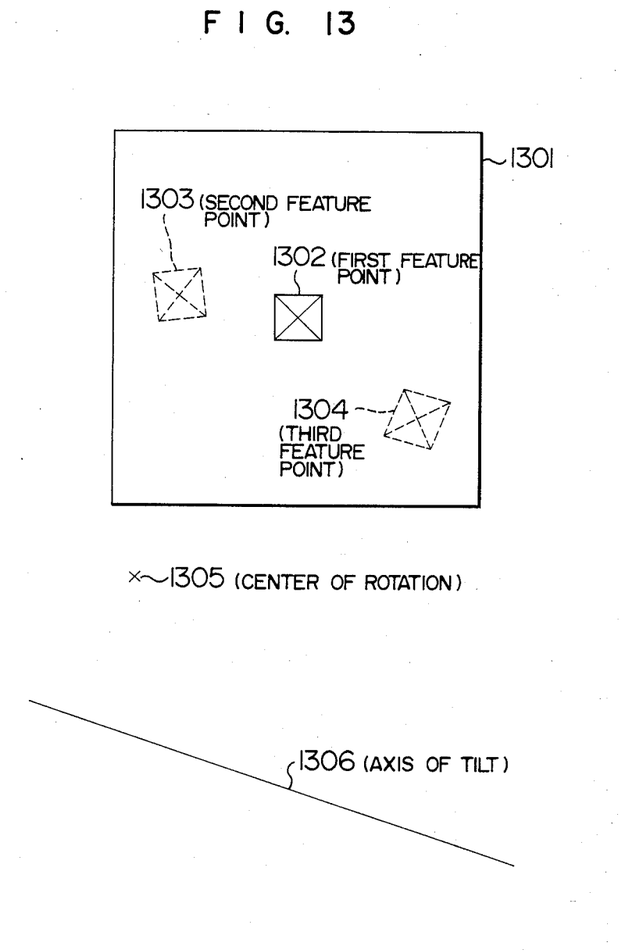
FIG. 13 is a schematic diagram showing a relation among positions of a feature point, the center of rotation and an axis of tilt.

Next, the center of rotation is calculated (step 305 of FIG. 3). This calculation will be explained below in detail, with reference to FIGS. 6 and 13. Referring to FIG. 6, an image is stored in the memory (step 601). Then, the specimen table is rotated (step 602). Thus, as shown in FIG. 13, a first feature point 1302 existing at the center of the display screen of the CRT 1301 is moved, and observed as a second feature point 1303. An image having the second feature point is stored in the memory (step 603). In step 604, the second feature point corresponding to the first feature point is determined by a correlation method similar to the above-mentioned correlation method. In step 605, the specimen table is rotated in a direction opposite to the rotational direction in the step 602. Thus, an image having a third feature point 1304 is formed. In step 606, this image is stored in the memory. In step 607, the third feature point corresponding to the first feature point is determined. In step 608, the position of the center of rotation is calculated. Since the specimen table has been tilted, the rotary motion about the center of rotation 1305 can be expressed by an ellipse, in which a ratio of the minor axis to the major axis is equal to $\tan\theta$ (where $\theta$ indicates an angle of tilt). The ellipse is determined by the first, second and third feature points, since the ratio of the minor axis to the major axis has been determined. Now, let us use an axis of tilt 1306 as a Y-axis, and use an axis perpendicular to the axis of tilt 1306 as an X-axis. When the position coordinates of the first, second and third feature points are expressed by $(x_1, y_1)$, $(x_2, y_2)$, and $(x_3, y_3)$, respectively, the position coordinates $x_0$ and $y_0$ of the center of rotation are given by the following equations:

$$x_0 = \frac{x_1^2(y_2 - y_3) + x_2^2(y_3 - y_1) + x_3^2(y_1 - y_2) - \cot^2\theta(y_3 - y_1)(y_1 - y_2)(y_2 - y_3)}{2\{x_1(y_2 - y_3) + x_2(y_3 - y_1) + x_3(y_1 - y_2)\}}$$

$$y_0 = \frac{y_1^2(x_2 - x_3) + y_2^2(x_3 - x_1) + y_3^2(x_1 - x_2) - \tan^2\theta(x_3 - x_1)(x_1 - x_2)(x_2 - x_3)}{2\{y_1(x_2 - x_3) + y_2(x_3 - x_1) + y_3(x_1 - x_2)\}}$$

Thus, the positional relation between an observed image and the specimen table can be known by the processing in the steps 303, 304 and 305.

Figure 7:
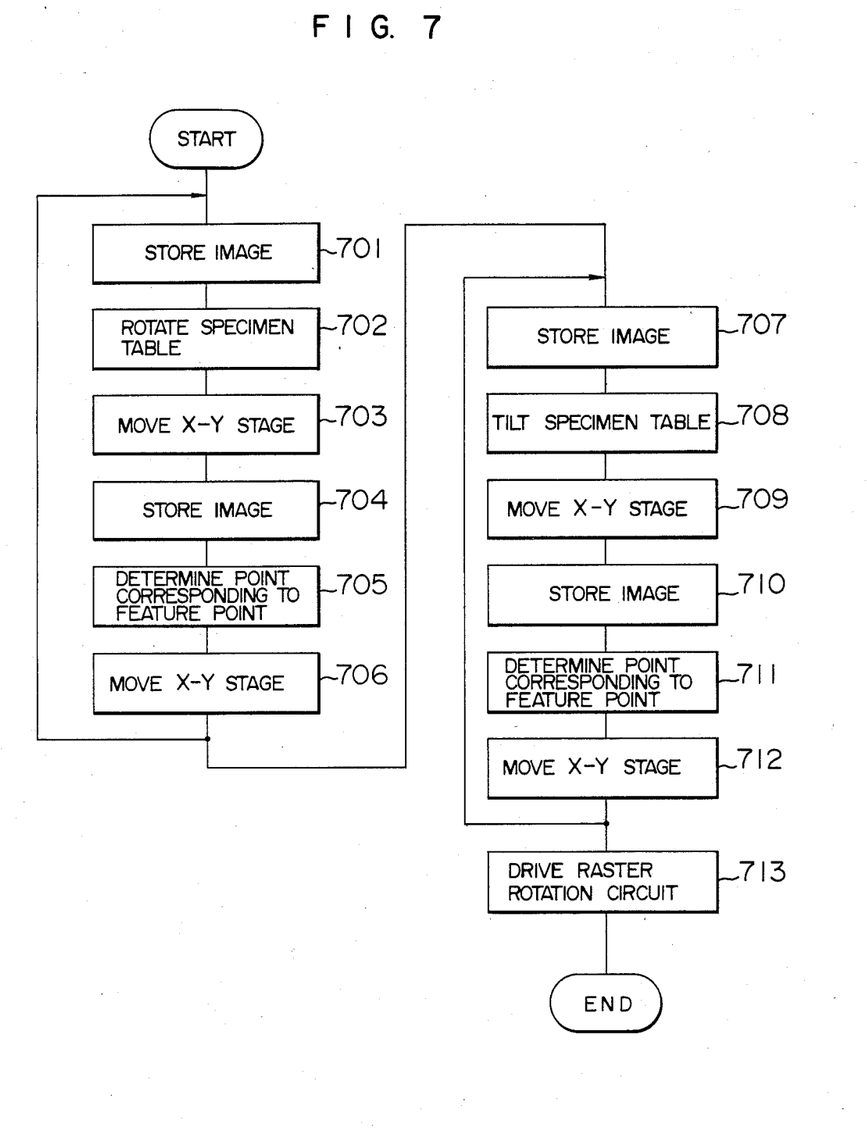
FIG. 7 is a flow chart showing the details of processing which is carried out in the step 307 of FIG. 3.
Figure 14:
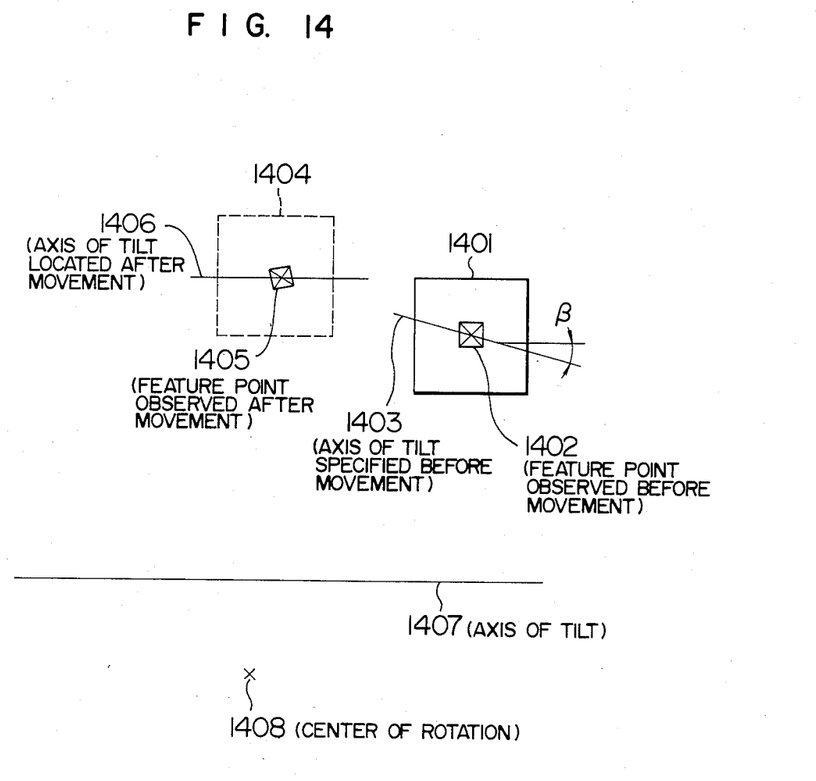
FIG. 14 is a schematic diagram showing the positions of a feature point which are observed before and after the movement of an axis of tilt.

Next, the amount of movement of each stage carried out in accordance with the tilt of image which is specified in the steps 301 and 302, is calculated (step 306). The specimen table and raster rotation mechanism of the present embodiment are small in degree of freedom. Hence, in many cases, it is impossible to perform a desired tilting operation strictly. Accordingly, the following operation is performed approximately. Referring to FIG. 14, an axis of tilt 1403 which is specified by an operator before the movement of the specimen table, intersects a feature point 1402 which is observed on the display screen of the CRT 1401 before the movement of the specimen table. Now, let us suppose that the axis of tilt 1403 lies in a horizontal plane and makes an angle $\beta$ with the axis of tilt 1407 of the specimen table. Further, let us consider a case where the specimen table is tilted by an angle $\theta$. When the specimen table is rotated through an angle $\tan^{-1}(\tan\beta/\cos\theta)$ about the center of rotation 1408, the axis of tilt 1403 intersecting the feature point 1402 is observed as an axis of tilt 1406 which intersects a feature point 1405 and is parallel to the axis of tilt 1407. When an angle of tilt $\Delta\theta$ is specified in the step 302, the specimen table is tilted by an angle $\Delta\theta' = \sin^{-1}(\sin\theta\cos\beta\cos\Delta\theta - \sqrt{1-\sin^2\theta\cos^2\theta}\sin\Delta\theta)$, to tilt the image by the angle $\Delta\theta$. In the image thus obtained, however, the feature point and axis of tilt specified in the steps 301 and 302 are rotated. Hence, the image is rotated through an angle $-\tan^{-1}\{\tan\beta/\cos(\theta+\theta')\}$ with the aid of the raster rotation circuit. This operation is an approximate one. Hence, the direction of the axis of tilt on the display screen is not accurately returned to an original one, but the specified angle of tilt can be accurately formed. By the above rotation processing, the feature point may go out of the display screen of the CRT. Accordingly, it is required to move the X-Y stage so that the feature point is observed on the display screen. The directions of the X- and Y-axes at the display screen, the position of the axis of tilt, and the position of the center of rotation have been calculated in the steps 303, 304 and 505. The amount of movement of each stage can be readily calculated. Finally, in step 307, each of the stages of the specimen table is moved on the basis of a value calculated in the step 306. However, in view of the mechanical accuracy of the specimen table, the rotating and tilting operations are not performed only once, but are performed little by little. Further, a positioning operation using a correlation coefficient is performed each time the specimen table is rotated or tilted. FIG. 7 shows a case where each of the rotating and tilting operations is performed a plurality of times. Referring to FIG. 7, the rotation processing is carried out in steps 701 to 706. It depends upon factors such as the mechanical accuracy of the specimen table how many times a rotating operation is performed. Now, let us consider a case where a rotating operation is performed five times. In step 701, an image is stored in the memory. Then, the specimen table is rotated through an angle equal to one-fifth a predetermined angle (step 702). In step 703, the X-Y stage is moved so that a feature point lies in the field of view. An image which is obtained after the X-Y stage has been moved, is stored in the memory (step 704). In step 705, a point corresponding to a feature point on the image which is stored in the step 701, is determined on the image stored in the step 704. In step 706, the X-Y stage is moved so that the feature point is placed at the center of the display screen. Then, the above processing in the steps 701 to 706 is repeated four times. The tilt processing is carried out in steps 707 to 712. It depends upon factors such as the mechanical accuracy of the specimen table how many times a tilting operation is performed. Now, let us consider a case where a tilting operation is performed five times. In step 707, an image which is obtained after the rotation processing has been completed, is stored in the memory. Then, the specimen table is tilted by an angle equal to one-fifth a predetermined angle of tilt (step 708). In step 709, the X-Y stage is moved so that the feature point lies in the field of view. An image which is obtained after the X-Y stage has been moved, is stored in the memory (step 710). In step 711, a point corresponding to a feature point on the image which is stored in the step 707, is determined on the image stored in the step 710. In step 712, the X-Y stage is moved so that the feature point is placed at the center of the display screen. Finally, the raster rotation circuit is driven so that an axis of tilt which is specified on the display screen, is returned to an original position. Thus, the tilt processing is completed.

Next, explanation will be made of the horizontal displacement which is carried out in steps 205 to 208 of FIG. 2. In the present embodiment, for example, the width of the display screen is used as the unit of horizontal displacement. Referring to FIG. 2, the amount of movement of the specimen table is calculated in accordance with the magnification of electron microscope (step 205). In step 206, the directions of the X- and Y-directions are calculated as in the step 303 of FIG. 3. In steps 207 and 208, the X-Y stage is moved in the X- and Y-directions so that desired horizontal displacement is carried out.

Thus, according to the present embodiment, the field of view can be automatically changed with regard to an image now observed.

As has been explained in the foregoing, according to the present invention, the field of view can be changed with regard to an image now observed, without being affected by the mechanical structure of a specimen table and a reduction in operation accuracy of the specimen table due to the wear thereof. That is, the present invention can improve the operability of a scanning electron microscope.

We claim:

1. A scanning electron microscope for scanning the surface of a specimen with an electron beam to detect a signal emitting from the specimen, thereby forming an image of the surface of the specimen, the scanning electron microscope comprising:

a specimen table capable of making a vertical movement, a horizontal movement, a rotating operation and a tilting operation;

arithmetic means for converting the emitted signal into a digital signal to store the digital signal, and for calculating the amount of each of the vertical movement, horizontal movement, rotating operation and tilting operation of the specimen table, on the basis of the stored information, information on the present state of the specimen table, operating conditions of the scanning electron microscope and an indication given from the outside; and a controller for controlling the specimen table on the basis of a calculated value from the arithmetic means.

2. A scanning electrical microscope according to claim 1, wherein the indication given from the outside specifies one of the vertical movement and horizontal movement of a field of view with respect to an image now observed.

3. A scanning electron microscope according to claim 1, wherein the indication given from the outside specifies one of the rotation and tilt of the field of view with respect to an image now observed.

4. A scanning electron microscope comprising:

an electron gun for emitting an electron beam to scan a specimen with the electron beam;

a specimen table load with a specimen, the specimen table being able to make a rotating operation, a tilting operation, a horizontal movement and a vertical movement;

detection means for detecting a signal emitted from the specimen;

storage means for storing the output of the detection means as a video signal;

display means for displaying an image on the basis of the video signal stored in the storage means;

arithmetic unit for calculating the amount of movement of the specimen table corresponding to at least one of the rotation, tilt, horizontal movement and vertical movement of the image, on the basis of the video signal stored in the storage means;

operation means for selecting at least one of the rotation, tilt, horizontal movement and vertical movement of the displayed image; and control means for moving the specimen table automatically in accordance with the selection made by the operation means, and on the basis of a value calculated by the arithmetic unit.

5. A method of moving an image formed by a scanning electron microscope, the scanning electron microscope including an electron gun for emitting an electron beam to scan a specimen with the electron beam, a specimen table loaded with a specimen and capable of making a rotating operation, a tilting operation, a horizontal movement and a vertical movement, detection means for detecting a signal which is emitted from the specimen scanned with the electron beam, storage means for storing the output of the detection means as a video signal, and display means for displaying an image on the basis of the video signal stored in the storage means, the method of moving the image, comprising the steps of:

selecting at least one of the rotation, tilt, horizontal movement and vertical movement of an image displayed by the display means;

calculating the amount of movement of the specimen table corresponding to at least one selected from the rotation, tilt, horizontal movement and vertical movement of the image, on the basis of the video signal stored in the storage means; and moving the specimen table automatically on the basis of a calculated value.

6. An apparatus for moving an image formed by a scanning electron microscope, the scanning electron microscope including an electron gun for emitting an electron beam to scan a specimen with the electron beam, a specimen table loaded with a specimen and capable of making a rotating operation, a tilting operation, a horizontal movement and a vertical movement, detection means for detecting a signal which is emitted from the specimen scanned with the electron beam, storage means for storing the output of the detection means as a video signal, and display means for displaying an image on the basis of the video signal stored in the storage means, the apparatus for moving the image, comprising:

means for selecting at least one of the rotation, tilt, horizontal movement and vertical movement of an image displayed by the display means;

means for calculating the amount of movement of the specimen table corresponding to at least one selected from the rotation, tilt, horizontal movement and vertical movement of the image, on the basis of the video signal stored in the storage means; and means for moving the specimen table automatically on the basis of a value calculated by the arithmetic unit.

* * * * *